(12) United States Patent
Gilliland et al.

(10) Patent No.: US 7,084,344 B1
(45) Date of Patent: Aug. 1, 2006

(54) V-SEAL EMC GASKET ASSEMBLY FOR PRECISE PLACEMENT, CONDUCTION AND RETENTION WITHOUT ADHESIVES

(75) Inventors: Don Alan Gilliland, Rochester, MN (US); Amanda Elisa Ennis Mikhail, Rochester, MN (US); Scott Alan Shurson, Mantorville, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/326,572

(22) Filed: Jan. 5, 2006

(51) Int. Cl.
*H05K 9/00* (2006.01)

(52) U.S. Cl. .................. 174/35 GC; 277/920

(58) Field of Classification Search .............. 174/35 R, 174/35 GC; 361/816, 818, 800; 277/920
See application file for complete search history.

(56) References Cited

U.S. PATENT DOCUMENTS

| | | | | |
|---|---|---|---|---|
| 4,572,921 A | * | 2/1986 | May et al. ............. | 174/35 GC |
| 4,864,076 A | * | 9/1989 | Stickney ................ | 174/35 GC |
| 5,070,216 A | * | 12/1991 | Thornton ............... | 174/35 GC |
| 5,511,798 A | * | 4/1996 | Kawamoto et al. ......... | 277/647 |
| 5,949,019 A | * | 9/1999 | Sirainen .................. | 174/35 R |
| 5,957,465 A | * | 9/1999 | Gonsalves et al. .......... | 277/637 |
| 6,150,606 A | * | 11/2000 | Matsumoto et al. ...... | 174/35 R |
| 6,239,973 B1 | * | 5/2001 | Taylor et al. ............... | 361/704 |
| 6,294,729 B1 | * | 9/2001 | Kaplo .................... | 174/35 GC |
| 6,483,023 B1 | * | 11/2002 | Jacques ................. | 174/35 GC |
| 6,538,197 B1 | * | 3/2003 | Kawai .................... | 174/35 GC |
| 6,613,976 B1 | * | 9/2003 | Benn, Jr. ............... | 174/35 GC |
| 6,714,423 B1 | * | 3/2004 | Nurmi ........................ | 361/818 |

\* cited by examiner

*Primary Examiner*—Hung V. Ngo
(74) *Attorney, Agent, or Firm*—Joan Pennington

(57) ABSTRACT

A V-seal EMC gasket assembly is provided for implementing precise placement, conduction and retention, while eliminating the need for adhesives. A V-seal EMC gasket and a supporting member include cooperating notch and protrusion features for positioning and retaining the V-seal EMC gasket on the supporting member. A distal end of the V-seal EMC gasket is received and retained within angled stops formed in the supporting member. A retaining clip member holds the V-seal EMC gasket in contact engagement with the supporting member. The protrusion features of the supporting member are received through corresponding mating slots formed near a first end of the retaining clip member, for example, in press-fit engagement. The angle stops formed in the supporting member hold a second end of the retaining clip member with the V-seal EMC gasket clamped and retained in position between the supporting member and the retaining clip member.

20 Claims, 2 Drawing Sheets

V-SEAL EMC GASKET ASSEMBLY FOR PRECISE PLACEMENT, CONDUCTION AND RETENTION WITHOUT ADHESIVES

FIELD OF THE INVENTION

The present invention relates generally to the field of electromagnetic compatibility (EMC) shielding, and more particularly, relates to an enhanced V-seal EMC gasket assembly for precise placement, conduction and retention without adhesives.

DESCRIPTION OF THE RELATED ART

As silicon technologies move toward smaller transistor sizes with smaller feature sizes, packaging densities increase, and operating frequencies increase, the need to contain or minimize electromagnetic interference (EMI) increases.

Electromagnetic compatibility (EMC) requires shielding to contain or minimize electromagnetic interference emissions from an electronic circuit packaging design. Gaskets often are used to fill and electronically bond and seal leaky apertures between mating panel member parts in order to maintain a minimum shielding effectiveness over a defined frequency spectrum. A V type seal EMC gasket or V-seal EMC gasket is used in some designs to meet EMC shielding requirements.

The V-seal EMC gasket is used for EMC containment because it is often the most appropriate and lowest cost gasket for a particular application. A problem with V-seal EMC gaskets is that with mechanical forces in the shear direction it is possible to pull or tear the gasket from its mounting when contacting the sliding surfaces. The V-seal EMC gasket can be slid or even pulled off when exposed to shear forces on the gasket.

Shear forces on the V-seal EMC gasket usually occur during installation assembly, and during removal of the covers, and moving the V-seal EMC gasket allows EMI emissions to escape from the enclosure. When the gasket is slid, the adhesive, either conductive or non-conductive, is smeared across the surface of the mechanical component.

In the case of non-conductive adhesive sliding the V-seal EMC gasket typically lowers the integrity of the connection of the gasket to the metallic surface, as optimal contact is not ensured. If the gasket is ripped or torn from its proper position, shielding integrity typically would be compromised.

Another concern with the use of the V-seal EMC gasket is that exact gasket placement at the time of assembly is required since a pressure sensitive adhesive is used without a guiding fixture, and can facilitate poor alignment.

A need exists for an effective mechanism for enabling precise placement, conduction, and retention of a V-seal EMC gasket without requiring adhesives.

SUMMARY OF THE INVENTION

A principal aspect of the present invention is to provide an enhanced V-seal EMC gasket assembly for implementing precise placement, conduction and retention without adhesives. Other important aspects of the present invention are to provide such enhanced V-seal EMC gasket assembly substantially without negative effect and that overcome many of the disadvantages of prior art arrangements.

In brief, an enhanced V-seal EMC gasket assembly is provided for implementing precise placement, conduction and retention, while eliminating the need for adhesives. A V-seal EMC gasket and a supporting member include cooperating notch and protrusion features for positioning and retaining the V-seal EMC gasket on the supporting member. A distal end of the V-seal EMC gasket is received and retained within angled stops formed in the supporting member. A retaining clip member holds the V-seal EMC gasket in contact engagement with the supporting member. The protrusion features of the supporting member are received through corresponding mating slots formed near a first end of the retaining clip member, for example, in press-fit engagement. The angle stops formed in the supporting member hold a second end of the retaining clip member with the V-seal EMC gasket clamped between the supporting member and the retaining clip member and retained in position.

In accordance with features of the invention, the supporting member is formed of an electrically conductive material. The supporting member is a metal member, for example, formed of sheet metal.

In accordance with features of the invention, the protrusion features for positioning and retaining the V-seal EMC gasket on the supporting member are relatively small angled tabs and cause a minimal impedance change on the supporting member. The V-seal EMC gasket is formed of a rigid material having sufficient strength and electromagnetic compatibility properties, such as a selected one of beryllium copper and stainless steel.

In accordance with features of the invention, the retaining clip member is formed of either an electrically nonconductive or electrically conductive material, for example, a plastic material or a metal material.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

Figure 1:
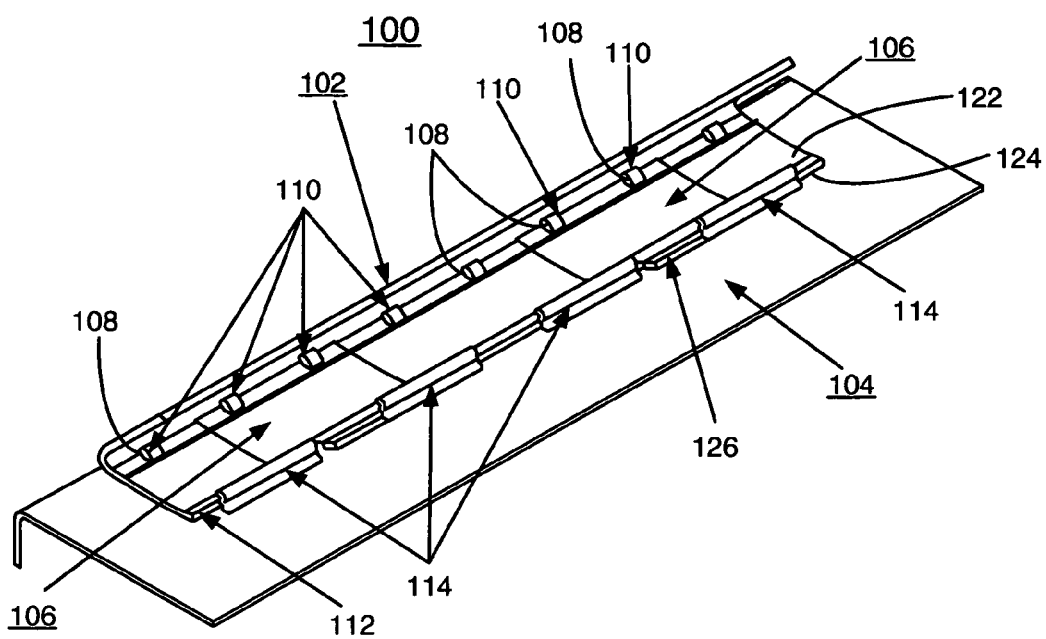
FIG. 1 is a perspective view not to scale of an enhanced V-seal EMC gasket assembly for implementing precise placement, conduction and retention in accordance with the preferred embodiment.
Figure 2:
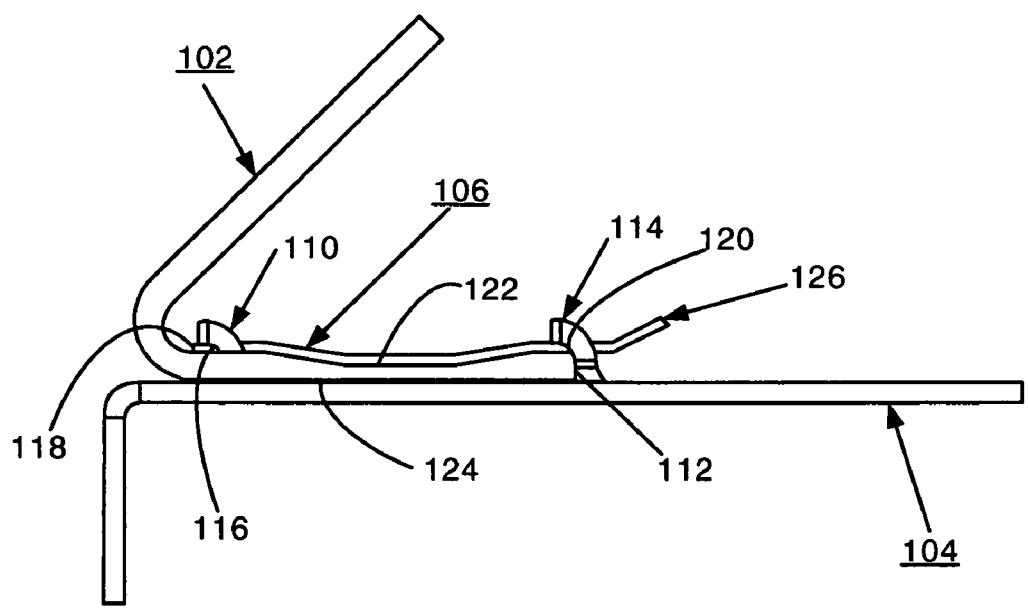
FIG. 2 is a side view not to scale of the enhanced V-seal EMC gasket assembly of FIG. 1 in accordance with the preferred embodiment.

Having reference now to the drawings, in FIG. 1, there is shown an enhanced V-seal EMC gasket assembly for implementing precise placement, conduction and retention generally designated by the reference character 100 in accordance with the preferred embodiment. V-seal EMC gasket assembly 100 includes a V-seal EMC gasket 102, a supporting member or chassis 104 of the preferred embodiment, and at least one retaining clip member or sheet 106 of the preferred embodiment.

In accordance with features of the invention, the enhanced V-seal EMC gasket assembly 100 enables precise placement, conduction and retention, while eliminating the need for adhesives. The V-seal EMC gasket 102 can be easily removed, for example for recycling, without any additional steps to remove remnants of an adhesive-type gasket as required by conventional V-seal EMC gasket arrangements.

In the V-seal EMC gasket assembly 100, the V-seal EMC gasket 102 and the supporting member 104 include a plurality of respective cooperating notches 108 and respective cooperating protrusion features 110 for positioning and retaining the V-seal EMC gasket 102 on the supporting member 104. A distal end 112 of the V-seal EMC gasket 102 is received and retained within a plurality of angled stops 114 formed in the supporting member 104.

The flat or non-flat retaining clip member 106 holds the V-seal EMC gasket 102 in contact engagement with the supporting member 104 and in slight compression. The protrusion features 110 of the supporting member are received through corresponding mating slots 116 formed near a first end 118 of the retaining clip member 106, for example, in press-fit engagement. The angled stops 114 formed in the supporting member 104 hold a second end 120 of the retaining clip member 106 with the V-seal EMC gasket 102 clamped and retained in position between the supporting member 104 and the retaining clip member 106.

The supporting member 104 is formed of an electrically conductive material. The supporting member 104 is a metal member, for example, formed of sheet metal. The protrusion features 110 for positioning and retaining the V-seal EMC gasket 102 on the supporting member 104 are relatively small angled tabs that cause a minimal impedance change on the supporting member.

V-seal EMC gasket 102 is formed of a rigid or compliant material having sufficient strength and electromagnetic compatibility properties, such as a selected one of beryllium copper and stainless steel or conductively coated foam. The retaining clip member 106 is formed of either an electrically nonconductive or electrically conductive material, for example, a plastic material or a metal material.

The protrusion features 110 and the angled stops 114 are integrally formed from the supporting member 104. For example, the protrusion features 110 and the angled stops 114 are punched and formed from the supporting member 104.

The normally shaped V-seal EMC gasket 102 is tightly held against the metallic surface 104 by the retaining clip member 106. The retaining clip member 106 can be implemented with a flat or non-flat thin plastic or metallic plate. The retaining clip member 106 is placed on an inside surface 122 of the V-seal EMC gasket 102. The metallic supporting surface 104 is in direct contact with a fabric over foam (FOF) bottom side 124 of the V-seal EMC gasket 102 without adhesive. If an adhesive is used between the plastic retaining clip member 106 and the V-seal EMC gasket 102, the adhesive would not be a problem since the adhesive would not be in a conduction path. The retaining clip member 106 includes an outwardly extending or protrusion portion 126 extending past the angled stops 114.

V-seal EMC gasket 102 is slit to form the cooperating notches 108 for receiving the protrusion features 110. The protrusion features 110 are small angled bends that go through the cooperating notches 108 in the V-seal gasket 102 and through the corresponding mating slots 118 in retaining clip member 106 inside the V-seal gasket. The flexibility or compliance of the V-seal EMC gasket 102 is not adversely affected by the addition of the retaining clip member 106.

The small bends defining protrusion features 110 hold the V-seal EMC gasket 102 in place with regard to shear forces and are not large enough to cause any significant impedance change on the metallic supporting surface 104. The rear angles 114 hold the edge 120 of the plastic retaining clip member 106 down onto the metallic supporting surface 104 and allows the V-seal EMC gasket 102 to align and clip into place.

The V-seal EMC gasket 102 gasket is removed easily, for example for recycling by slightly pushing in or pulling up on the protrusion portion 126 of the plastic retaining clip member 106 that extends past or behind the back angled stops 114.

While the present invention has been described with reference to the details of the embodiments of the invention shown in the drawing, these details are not intended to limit the scope of the invention as claimed in the appended claims.

What is claimed is:

1. A V-seal EMC gasket assembly comprising:
a supporting member;
a V-seal EMC gasket disposed on said supporting member;
said V-seal EMC gasket and said supporting member including respective cooperating notch and protrusion features for positioning and retaining the V-seal EMC gasket on said supporting member;
said supporting member including a plurality of angled stops;
a distal end of said V-seal EMC gasket being received and retained within said angled stops; and
a retaining clip member for holding said V-seal EMC gasket in contact engagement with said supporting member; said retaining clip member including corresponding mating slots formed near a first end of said retaining clip member receiving said protrusion features of said supporting member; and a second end of said retaining clip member being received in at least one of said plurality of angled stops.

2. A V-seal EMC gasket assembly as recited in claim 1 wherein said supporting member is formed of an electrically conductive material.

3. A V-seal EMC gasket assembly as recited in claim 1 wherein said supporting member is a metal member.

4. A V-seal EMC gasket assembly as recited in claim 1 wherein said supporting member is formed of electrically conductive sheet metal.

5. A V-seal EMC gasket assembly as recited in claim 1 wherein said protrusion features are integrally formed of said supporting member.

6. A V-seal EMC gasket assembly as recited in claim 1 wherein said protrusion features are angled tabs, and wherein a minimal impedance change on the supporting member results from said protrusion features.

7. A V-seal EMC gasket assembly as recited in claim 1 wherein said V-seal EMC gasket is formed of a rigid material.

8. A V-seal EMC gasket assembly as recited in claim 1 wherein said V-seal EMC gasket is formed of a selected one of beryllium copper and stainless steel.

9. A V-seal EMC gasket assembly as recited in claim 1 wherein said retaining clip member is formed of an electrically nonconductive material.

10. A V-seal EMC gasket assembly as recited in claim 1 wherein said retaining clip member is formed of a plastic material.

11. A V-seal EMC gasket assembly as recited in claim 1 wherein said protrusion features of said supporting member are received in press-fit engagement through said corresponding mating slots of said retaining clip member.

12. A V-seal EMC gasket assembly as recited in claim 1 wherein said V-seal EMC gasket is clamped and retained in position on said supporting member by said retaining clip member.

13. A V-seal EMC gasket assembly as recited in claim 1 wherein said retaining clip member includes a portion extending past said plurality of angled stops.

14. A V-seal EMC gasket assembly comprising:
   a supporting member; said supporting member being formed of an electrically conductive material
   a V-seal EMC gasket disposed on said supporting member; said V-seal EMC gasket formed of a rigid material having electromagnetic compatibility properties;
   said V-seal EMC gasket and said supporting member including respective cooperating notch and protrusion features for positioning and retaining the V-seal EMC gasket on said supporting member;
   said supporting member including a plurality of angled stops;
   a distal end of said V-seal EMC gasket being received and retained within said angled stops; and
   a retaining clip member for holding said V-seal EMC gasket in contact engagement with said supporting member; said retaining clip member including corresponding mating slots formed near a first end of said retaining clip member receiving said protrusion features of said supporting member; and a second end of said retaining clip member being received in at least one of said plurality of angled stops.

15. A V-seal EMC gasket assembly as recited in claim 14 wherein said V-seal EMC gasket is formed of a selected one of beryllium copper and stainless steel.

16. A V-seal EMC gasket assembly as recited in claim 14 wherein said retaining clip member is formed of a plastic sheet material.

17. A V-seal EMC gasket assembly as recited in claim 14 wherein said protrusion features of said supporting member are received in press-fit engagement through said corresponding mating slots of said retaining clip member.

18. A V-seal EMC gasket assembly as recited in claim 14 wherein said V-seal EMC gasket is clamped and retained in position on said supporting member by said retaining clip member.

19. A V-seal EMC gasket assembly as recited in claim 14 wherein said protrusion features are angled tabs, and wherein substantially no impedance change on the supporting member results from said protrusion features.

20. A V-seal EMC gasket assembly as recited in claim 14 wherein said protrusion features and said plurality of angled stops are integrally formed of said supporting member.

* * * * *